US005112231A

United States Patent [19]

Harwath et al.

[11] Patent Number: 5,112,231

[45] Date of Patent: May 12, 1992

[54] ELECTRICAL CARD EDGE CONNECTOR ASSEMBLY

[75] Inventors: Frank A. Harwath, Downers Grove; Kent E. Regnier, Lombard; Dennis Scheer, Hanover Park, all of Ill.

[73] Assignee: Molex Incorporated, Lisle, Ill.

[21] Appl. No.: 717,587

[22] Filed: Jun. 19, 1991

Related U.S. Application Data

[63] Continuation of Ser. No. 501,577, Mar. 30, 1990, Pat. No. 5,071,371.

[51] Int. Cl.[5] .................... H05K 1/00

[52] U.S. Cl. .................... 439/60; 439/637

[58] Field of Search .................... 439/630-637, 439/62, 59, 60, 61

[56] References Cited

U.S. PATENT DOCUMENTS 3,421,136 1/1969 Bowley et al. .................... 339/217
3,631,381 12/1971 Pittman .................... 339/176 MP
4,226,496 10/1980 Langham .................... 339/176 MP
4,298,237 11/1981 Griffith et al. .................... 339/17 L
4,713,013 12/1987 Regnier et al. .................... 439/62
4,869,672 9/1989 Andrews, Jr. .................... 439/60
4,891,023 1/1990 Lopata .................... 439/637
4,993,972 2/1991 Lin .................... 439/637

FOREIGN PATENT DOCUMENTS 1013151 12/1965 United Kingdom .................... 439/637

*Primary Examiner*—David L. Pirlot
*Attorney, Agent, or Firm*—Charles S. Cohen; Stephen Z. Weiss

[57] ABSTRACT

A card edge electrical connector is shown for providing electrical connections between a printed circuit card and a printed circuit board wherein the printed circuit card has either a 32 bit or a 16 bit capacity. The connector includes a housing having a retaining post that is inserted into an aperture of the printed circuit board to retain the connector to the printed circuit board. The retaining post is tubular having an axial slot extending through the sidewall thereof so as to be resilient and durable. Further, each of the contacts disposed within the connector housing includes a stabilizing arm that opposes the forces created by the insertion of the printed circuit card into the connector housing so as to distribute the opposing forces between the stabilizing arm and the base of the contact. Contacts of alternating sizes and having beams of different angles with the base are employed in the connector. However the contacts have equal path lengths between the printed circuit board and the top of the connector housing through the respective contacts.

6 Claims, 5 Drawing Sheets

ELECTRICAL CARD EDGE CONNECTOR ASSEMBLY

This is a continuation of copending application Ser. No. 07/501,577 filed on Mar. 30, 1990 U.S. Pat. No. 5,071,371.

The present invention relates to a card edge connector assembly that provides electrical connections between a printed circuit card and a printed circuit board and more particularly to such an electrical connector that is operable with printed circuit cards of either 32 bit or 16 bit capacity, the connector having improved means for retaining the connector to the printed circuit board; stabilized contacts within the connector housing and contacts of different sizes but equal electrical path length between the printed circuit board and the top of the connector housing through the contacts.

BACKGROUND OF THE INVENTION

Card edge connector assemblies are known for providing electrical connections between a printed circuit board and printed circuit cards having either a 32 bit capacity or a 16 bit capacity. Known connector assemblies include a housing having first and second sidewalls with a cavity therebetween for accepting a contact edge of the printed circuit card. Each of the sidewalls of the connector housing is formed with slots therein, each slot receiving a beam type electrical contact having a contact point that extends into the cavity so that when the printed circuit card is inserted into the cavity, the connector contacts exert a force on the card contacts that is normal to the plane of the card contacts. In order to accommodate either a 32 bit or 16 bit capacity card edge, connector contacts having high contact points and low contact points are employed wherein the contacts are arranged in a staggered relationship along each sidewall such that contacts with high contact points are positioned adjacent to contacts with low contact points and visa versa. For a 16 bit capacity card, the card contacts engage only the high contact points of the connector and for a 32 bit capacity card, the card contacts engage both the high and the low contact points of the connector.

When the contact card is inserted into the cavity of the connector housing, a force is exerted on the connector contacts tending to move the contacts in a direction perpendicular to the plane of the card. This force also creates a moment that tends to rotate the contacts. In known connector assemblies the forces opposing the force created by the card are concentrated in the base of each of the contacts creating stress therein.

Further, the housing for known card edge connector assemblies typically include a retaining member extending outwardly from the base of the housing wherein the retaining member is accepted into an aperture in the printed circuit board. The retaining member is such as to provide an interference fit with the sidewall of the printed circuit board aperture so as to maintain the printed circuit board and the connector together during wave soldering. Known retaining members have included a solid cantilever member with a cross section that is circular, rectangular, etc. These retaining members create a frictional force in a direction opposite to the direction of the withdrawal path of the retaining member from the printed circuit board aperture. Generally, the greatest stress occurs in the base of the retaining member adjacent to the base of the housing, the stress often resulting in fractures or breaks when the retaining member is withdrawn from the printed circuit board aperture. Another type of retaining member has a circular cross section with a pie shaped segment removed therefrom. When this type of retaining member is inserted into the printed circuit board aperture, the pie shaped opening is compressed creating a torsional stress within the retaining member that in turn creates a frictional force in a direction opposite to the direction of the withdrawal path of the retaining member. Again, because this type of retaining member is fairly rigid, fractures and breaks occur when the retaining member is withdrawn from the printed circuit board aperture.

SUMMARY OF THE INVENTION

In accordance with the present invention, the disadvantages of prior card edge connector assemblies as discussed above have been overcome. The card edge connector assembly of the present invention includes a more durable member for retaining the connector secured to the printed circuit board; stabilized contacts that distribute the forces opposing the normal force created by the insertion of the printed circuit card into the connector; and contacts of different size but having a uniform electrical path length between the top of the connector housing and the printed circuit board; exerting the same normal force on the printed circuit board; and contacts designed and arranged to eliminate cross talk.

More particularly, the electrical card edge connector of the present invention includes a housing having a base, first and second parallel sidewalls and an elongated cavity extending generally parallel to the sidewalls for receiving card contacts. A plurality of partition walls extend inwardly from each of the sidewalls to the cavity, the partition walls being spaced to form slots therebetween for receiving contacts. The connector housing also includes a web positioned between the sidewalls of the housing and extending parallel thereto along the base of the housing. A plurality of contacts are provided, each contact having a base, means extending in one direction from the base for contacting the printed circuit board, a beam section extending from the base in a second direction opposite to the one direction and a card contact section extending from the beam section. Each of the connector contacts is received into a respective slot in the connector housing with the base of the contact being held between one of the housing sidewalls and the web to provide an interference fit therebetween. A portion of the card contact section of each connector contact extends into the cavity of the housing so as to engage a card contact when the printed circuit card is received in the cavity of the connector housing. Each connector contact further includes a means extending from the base of the connector contact in the second direction and abutting a length of the sidewall of the connector housing to oppose the normal force exerted by the card contacts, the opposing forces being distributed throughout the base of the contact and the force opposing means. The normal force exerted by the contact on the printed circuit board is equal for both the long and short contacts. This is due to a compensating design factor in the beam section.

The force opposing means of each connector contact is preferably in the form of a stabilizing arm spaced from the beam section of the contact. Each of the sidewalls of the connector housing is formed with indentations in the slots of the housing to accommodate the stabilizing arms of the contacts wherein an end of each of the indentations abuts an end of a respective stabilizing arm to form a contact stop that resists movement of the contact farther into the slot than is desired when the connector assembly is mounted on the printed circuit board. Further, although contacts of varying heights may be employed, the retaining arms of each of the contacts is of the same length and the indentations formed in the housing sidewalls are of the same length so that each slot may accommodate contacts of varying height.

The contacts of varying height that may be received in the slots of the connector housing may include first contacts having a high contact point and second contacts having a low contact point. The first and second contacts are formed such that the distance from a top surface of the connector housing to the high contact point of a first contact plus the distance from the high contact point through the first contact to the printed circuit board is equal to the distance from the top surface of the connector housing to the low contact point of a second contact plus the distance from the low contact point through the second contact to the printed circuit board. This design results in an equal electrical path length between the printed circuit board and the top of the connector housings through the contacts. In digital communication timing of the signal is critical. If the timing of the signals in the short and long contacts are different, then the information received will be out of sequence and garbled. To compensate for an out of timing sequence, the signal must be checked and resequenced, but this compensation requires a slowing of the computer system.

The connector housing of the present invention also includes a retention post that extends outwardly from the base of the housing wherein the retention post is hollow having a tubular sidewall with an axially extending slot formed therein. The outer diameter of the retention post is greater than the diameter of the aperture in the printed circuit board in which the retention post is inserted. The axial slot of the retention post is compressed as the post is inserted into the printed circuit board aperture so as to create a frictional force in a direction opposite to the direction of withdrawal of the post from the printed circuit board aperture. The retention post of the present invention is more resilient and durable then prior retaining members. Further, because the retaining post is more durable, the housing and integrally formed retaining post may be formed of more rigid materials than has heretofore been possible, such rigid materials generally being less costly.

These and other objects, advantages and novel features of the present invention, as well as details of an illustrative embodiment thereof, will be more fully understood from the following description and from the drawing.

DESCRIPTION OF THE PREFERRED EMBODIMENT

Figure 1:
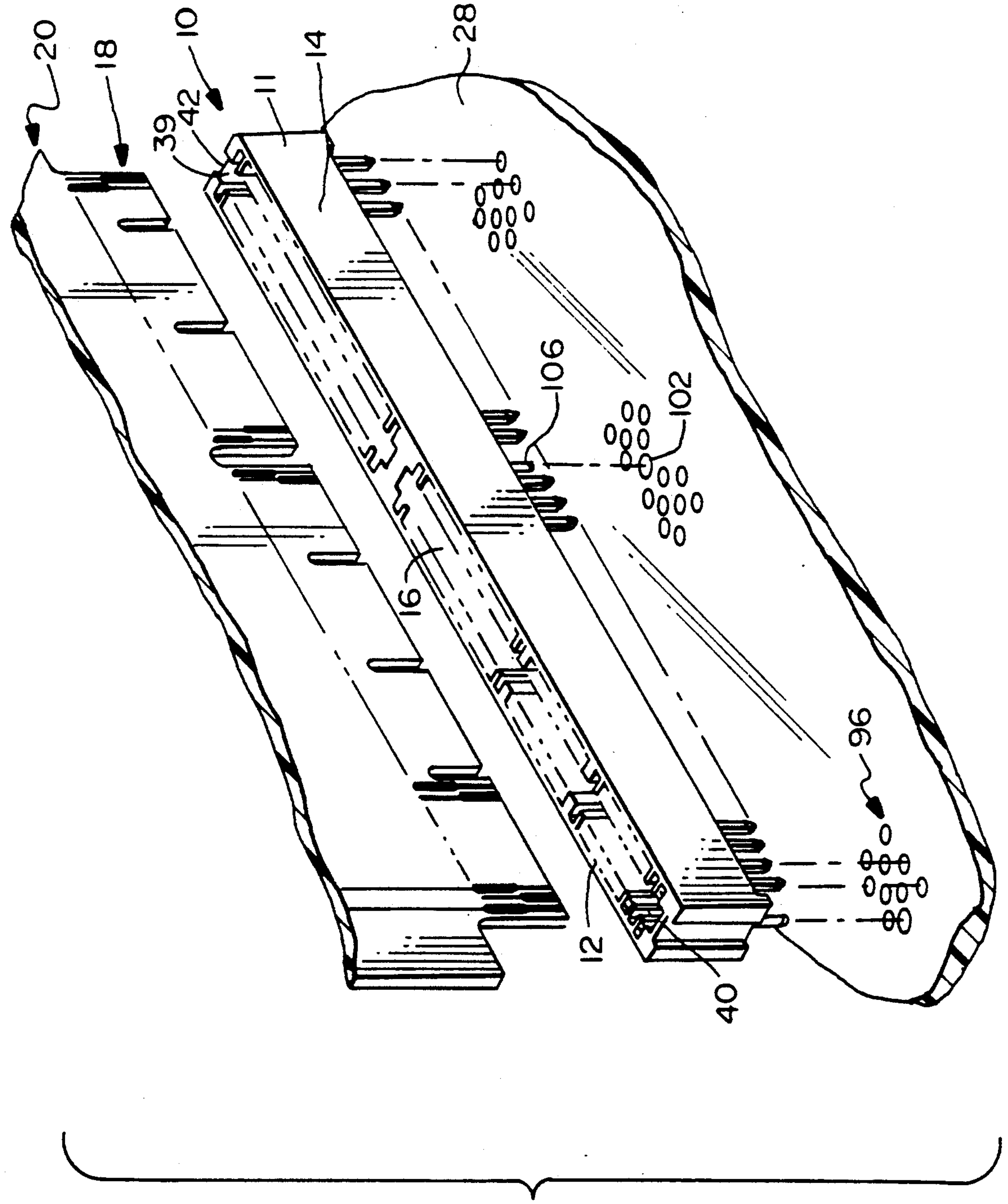
FIG. 1 is a perspective view of the card edge connector assembly of the present invention illustrated in relation to a printed circuit card and a printed circuit board.

The card edge connector 10 of the present invention, as illustrated in FIG. 1 includes a connector housing 11 with first and second parallel sidewalls 12 and 14 and a cavity 16 disposed therebetween. The cavity 16 receives a contact edge 18 of a printed circuit card 20. Each of the sidewalls 12 and 14 of the connector housing 11 includes a number of slots 30, 32 formed therein for receiving contacts 34, 36 that provide an electrical connection between the contacts of the printed circuit card 20 and a printed circuit board 28.

Figure 7:
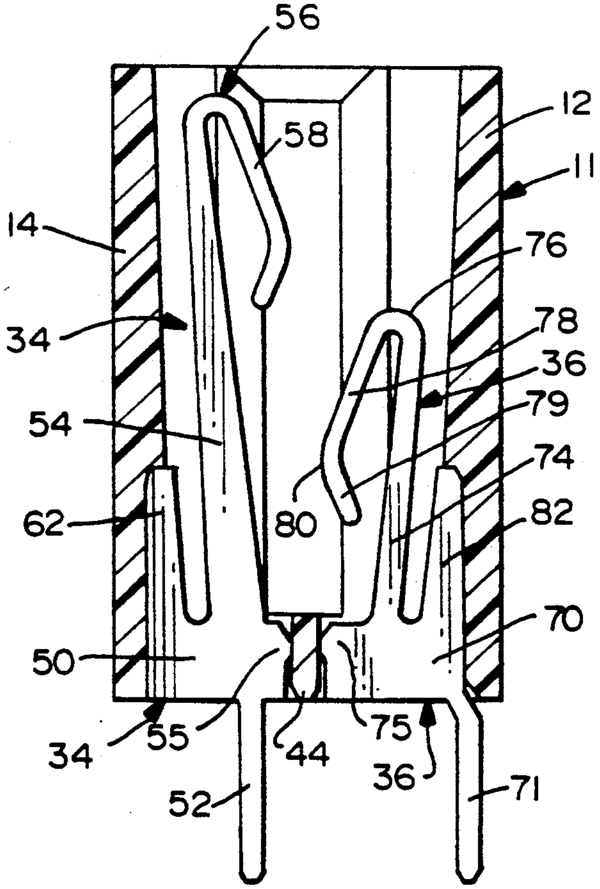
FIG. 7 is a segmented cross sectional view illustrating two slots of the connector housing, one slot having a long contact mounted therein and the other slot having a short contact mounted therein.
Figure 8:
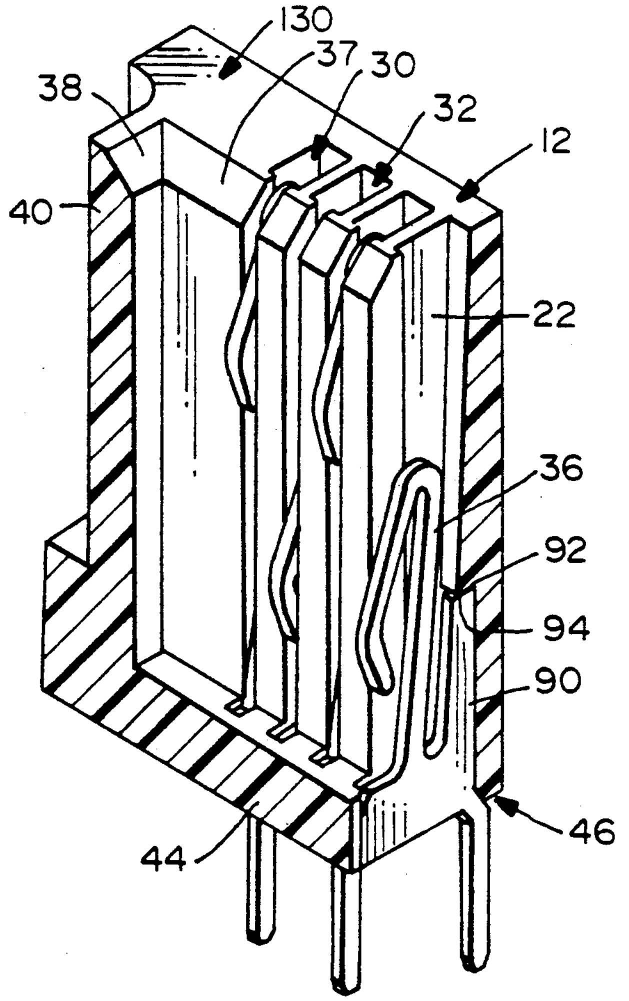
FIG. 8 is a partial perspective view of a cross section of the connector assembly shown in FIG. 1.

More particularly, as shown in FIGS. 1, 7 and 8, the sidewalls 12 and 14 of the connector housing 11 are formed with partition walls 22 extending inwardly from the respective sidewalls 12 and 14 to the cavity 16, the slots 30, 32 being formed between adjacent partition walls 22. An upper surface 37 of each partition wall and an upper surface 38, 39 of the respective end walls 40, 42 of the connector housing 11 are beveled so as to aid the ease with which the contact edge 18 of the printed circuit card 20 is inserted into the cavity 16. The base of the connector housing 11 is formed with a web 44 extending between the sidewalls 12 and 14, the web forming a floor of the cavity 16. The base 24 of the connector housing 11 also includes a number of apertures 46 that lead to respective slots 30, 32 in the connector housing 11 wherein respective long and short contacts 34 and 36 are press fit into the respective slots 30 and 32 through the apertures 46.

The long and short connector contacts 34 and 36 are planar contacts that are formed by stamping a conductive material. The long contacts 34 are formed with a base 50, tail 52 extending downwardly from the base and a beam section 54 that extends upwardly from the base 50 to a U-shaped section 56. The U-shaped section 56 of each long contact 34 extends into a straight section 58 that is angled outwardly from the beam section 54, the section 58 extending into another straight section 59 that is angled inwardly towards the beam section 54 wherein the apex between the sections 58 and 59 forms a contact point 60 of the contact 34. A stabilizing arm 62 is formed as a integral part of each long contact 34, the stabilizing arm 62 extending a given distance upwardly from the base 50 of the contact 34. During the stamping process, a number of long contacts 34 are formed together, the contacts being interconnected by a web 64 that is subsequently severed from the contact tail 52.

Similarly, the short contacts 36 are formed with a base 70, spaced tail 71 extending downwardly from the base 70 and a beamed section 74 that extends upwardly from the base 70 to a U-shaped section 76. The U-shaped section 76 of the short contact 36 extends into a straight section 78 that is angled outwardly from the beamed section 74, the section 78 extending into another straight section 79 that is angled inwardly towards the beamed section 74 wherein the apex between the sections 78 and 79 form a contact point 80 of the short contact 36. A stabilizing arm 82 is formed as an integral part of each short contact 36, the stabilizing arm 82 extending a given distance upwardly from the base 70 of the contact 36. During the stamping process a number of the contacts 36 are formed together the contacts 36 being interconnected by a web 84 that is subsequently severed from the contact tails 71 and 72.

As can be seen in FIG. 8, the long contacts 34 and the short contacts 36 are received in alternating slots 30, 32 in each sidewall 12, 14 of the connector housing 11 so that the long contacts 34 are disposed in slots adjacent to slots in which short contacts 36 are disposed and the short contacts 36 are disposed in slots adjacent to slots in which long contacts 34 are disposed. Preferably, slots in the sidewall 12 that contain long contacts 34 are directly opposite to slots in the sidewall 14 containing short contacts 36. Similarly, slots in the sidewall 12 containing short contacts 36 are preferably disposed across the cavity 16 from slots in the sidewall 14 also containing long contacts 34.

Alternating the long and short contacts and designing the beams of the long and short contacts to have a different angle to one another, and to the housing base, reduces the cross talk between the lines. Cross talk is created when a signal in one contact is superimposed upon a signal in an adjacent contact. This super imposition is caused by inductance. Inductance is minimized when the metal contacts are maintained as far apart as possible. Where that is not practical, as in this application, then the area of overlapping adjacent contact surfaces may be reduced. Such a reduction can be done by alternating the long and short contacts and by designing the beams of the long and short contacts to have a different angle to one another and to the housing base.

Each contact 34, 36 is pressed into a respective slot 30, 32 through an aperture 46 formed in the base 24 of the housing 11 such that the base 50, 70 of the contact 34, 36 provides an interference fit between the respective sidewall 12, 14 of the housing 11 and the web 44. The base 50, 70 of each of the contacts 34, 36 further includes an outwardly extending protrusion 55, 75 that digs into the web 44 when the contacts are press fit into the slots 30, 32 so as to maintain the contacts securely in position. Each of the sidewalls 12, 14 in each of the slots 30, 32 are formed with an indentation 90 that receives the stabilizing arm 62, 82 of the respective contact 34, 36. An end 92 of each indentation 90 forms a stop that is engaged by an end 94 of the stabilizing arm 62, 82 wherein the stop 92 resists the contact 34, 36 from being pushed upward during insertion of the contact tails 51, 52, 71, and 72 into the respective holes 96 formed in the printed circuit board 28. It is noted that the retaining arms 62 and 82 of the long and short contacts 34 and 36 are the same length so that the size of the indentations 90 formed in the slots 30, 32 may be of the same length. This enables each slot 30, 32 to receive long contacts 34 or short contacts 36 as desired.

As can be seen in FIGS. 7 and 8, each stabilizing arm 62, 82 of the contacts 34, 36 abuts a length of the sidewall 12, 14 forming the indentation 90. When the contact edge 18 of the printed circuit card 20 is inserted into the cavity 16 of the connector housing 11, the card 20 exerts a force normal or perpendicular to the plane of the contact edge 18 at the contact point 60, 80 of the connector 32, 34. The retaining arm 62, 82 along with the base 50, 70 of the contact 32, 34 opposes this normal force through beam sections 54 and 74 so as to distribute the opposing forces between the base 50, 70 and retaining arm 62, 82. Because the forces opposing the normal force created by the card 20 are distributed throughout not only the base 50, 70 of the contact 34, 36 but through the retaining arm 62, 82 of the contact 34, 36, the contacts 34 and 36 are more durable as well as more stably maintained within the slots 30, 32 of the connector housing 11.

Figure 2:
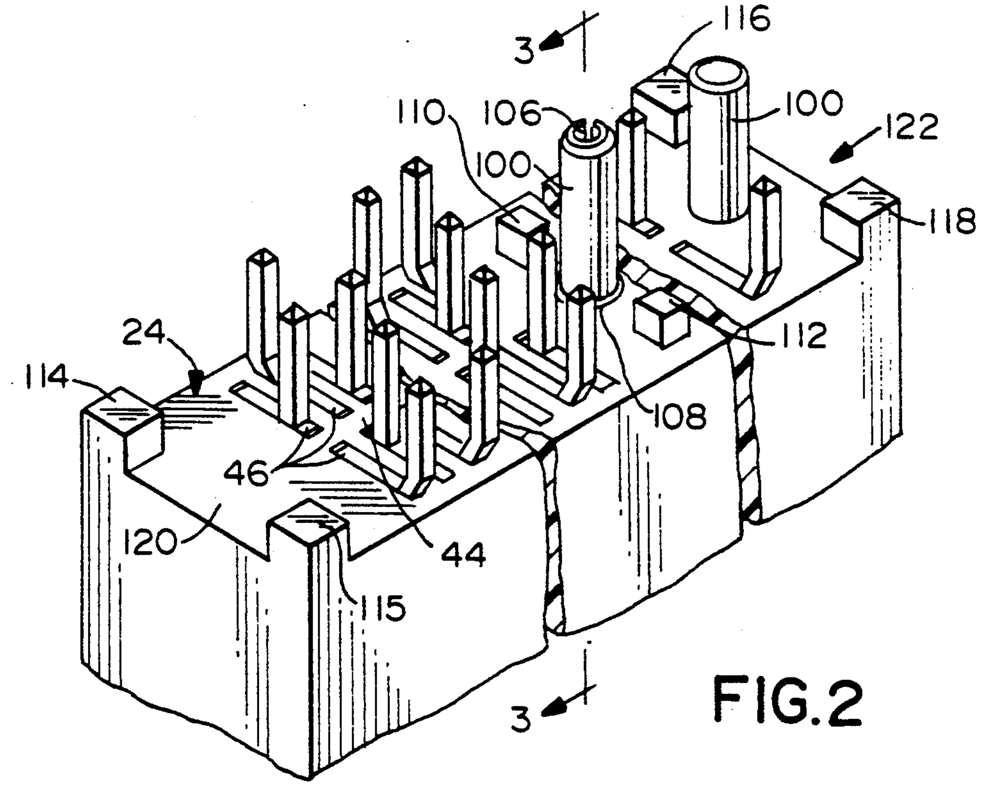
FIG. 2 is a partial perspective view of the bottom of the connector assembly shown in FIG. 1.

As shown in FIG. 2, the base 24 of the connector housing 11 includes a retaining post 100 that extends outwardly therefrom wherein the retaining post 100 is received in an aperture 102 formed in the printed circuit board 28 so as to retain the connector housing 11 secured to the printed circuit board 28 during wave soldering. The connector housing 11 also includes an aligning post 104 which is received in another aperture of the printed circuit board 28 so as to maintain the alignment between the connector housing 11 and the printed circuit board 28.

Figure 3:
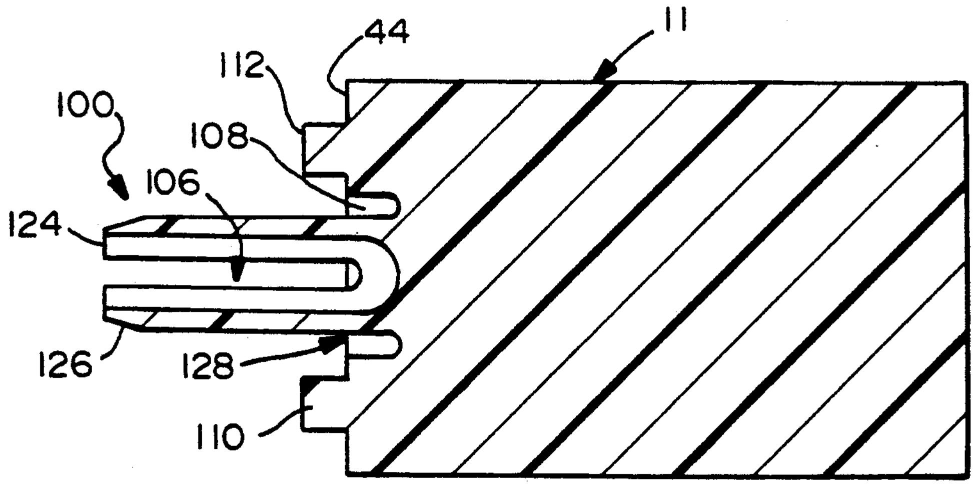
FIG. 3 is a cross section of the connector housing taken along lines 3—3 of FIG. 2 illustrating the retaining post of the present invention.
Figure 4:
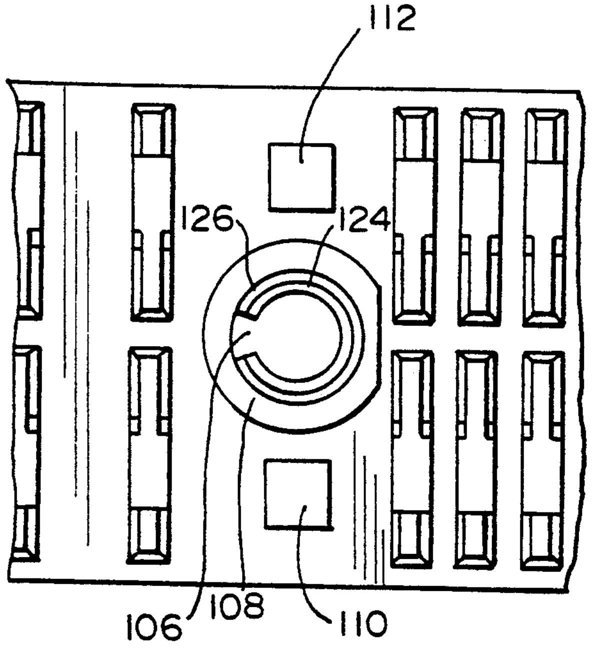
FIG. 4 is a partial bottom view of the connector housing illustrating the configuration of the retaining member shown in FIG. 3.
Figure 5:
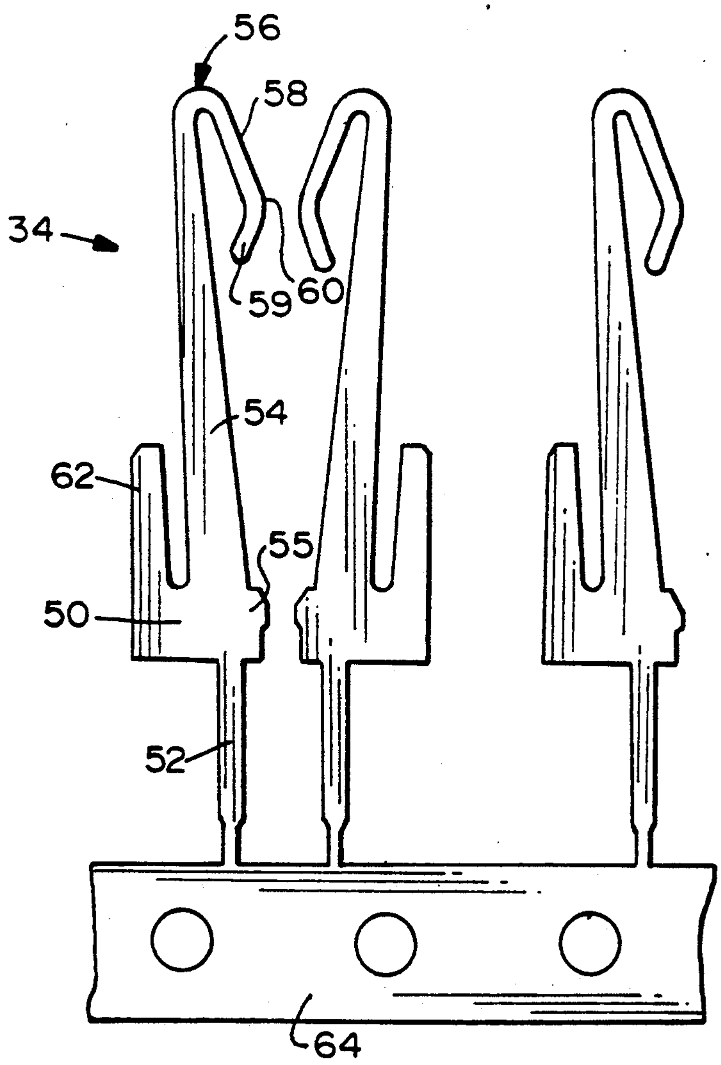
FIG. 5 is a front view of long contacts as formed during a stamping process.
Figure 6:
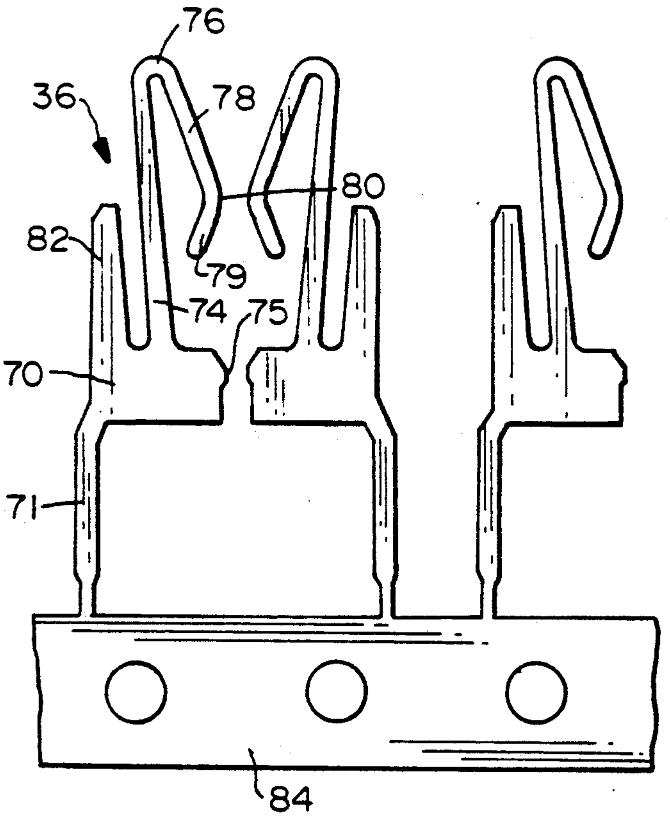
FIG. 6 is a front view of short contacts as formed during a stamping process.

The retaining post 100 as shown in greater detail in FIGS. 3 and 4 is a tubular member, the retaining post being hollow, and has an axially extending slot 106 in the sidewall 124 thereof. More particularly, the retaining post 100 has a C-shaped cross section wherein the slot 106 extends over an approximately 40 degree arc. The retaining post 100 extends outwardly from a circular indentation 108 that is formed into the base of the housing 11. Further, a pair of standoffs 110 and 112 are disposed on opposite sides of the retaining post 100 to form a mounting surface for the printed circuit board 28 with standoffs 114, 115 and 116, 118 disposed at respective ends 120 and 122 of the connector housing 11. The outer diameter of the retaining post 100 is greater than the diameter of the aperture 102 in the printed circuit board 28 so that when the retaining post 100 is inserted into the aperture 102 the axial slot 106 is compressed creating a frictional force in the direction opposite to the direction of withdrawal of the post 100 from the aperture 102. The sidewall 124 of the retaining post 100 deforms more easily at the outer end 126 of the retaining post 100 than the end 128 of the post 100 that is adjacent to the base 44 of the housing 11. The standoffs 110 and 112 insure that the aperture 102 of the printed circuit board 28 receives a resilient portion of the retaining post 100 so as to prevent fractures and breaks in the retaining post 100 when the post 100 is withdrawn from the aperture 102. The indentation 108 in the base of the housing 11 from which the retaining post 100 extends further adds to the resiliency of the retaining post. Because the retaining post 100 is very durable, the housing 11 and integrally formed retaining post 100 may be formed of polyphenylene sulfid (PPS) which is generally more rigid but less expensive than other materials previously used to form connector housings with solid retaining members. Further, the outer end 126 of the retaining post is tapered to an outer diameter that is less than the diameter of the aperture 102 to aid the ease with which the post 100 is inserted into the aperture 102.

Figure 9:
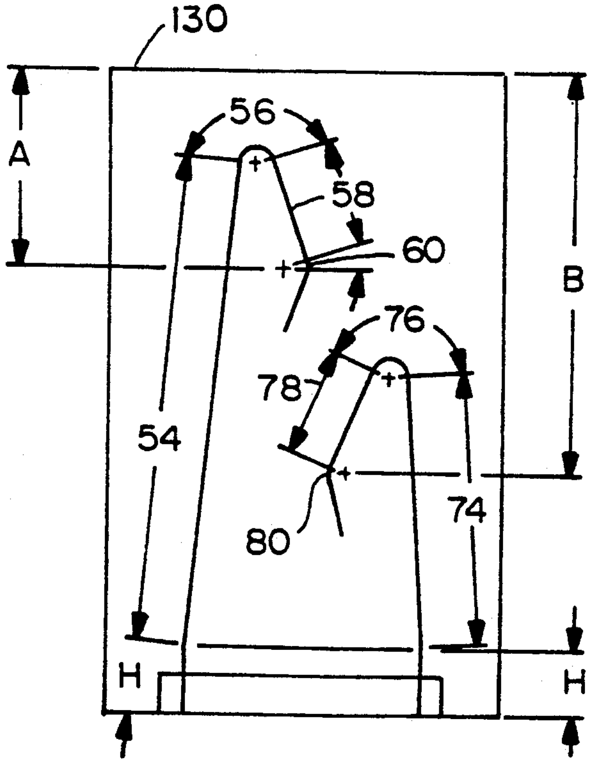
FIG. 9 is a graph illustrating the path lengths from the top of the connector housing through respective long and short contacts to the printed circuit board.

As shown with respect FIG. 9, although the height of the contacts 34 and 36 suitable for use in the connector assembly 10 vary, the electrical path length from the top surface of the connector 130 to the contact point of the respective contact 60, 80 and through the connector to the printed circuit board is equal for the various contacts. More particularly, the distance A from the top 130 of the connector housing 11 to the contact point 60 of the long contact 34 plus the length of the contact sections 58, 56 and 54 and the height H that represents the distance of the tail 52 to the printed circuit board 28 is equal to the distance B from the top 130 of the connector housing 11 to the low contact point 80 plus the length of the segments 78, 76 and 74 plus the height H. Because the electrical path lengths of the contacts are equal, signal skew or out of timing sequence is avoided.

Many modifications and variations of the present invention are possible in light of the above teachings. Thus, it is to be understood that, within the scope of the appended claims, the invention may be practices otherwise than as described hereinabove.

What is claimed and desired to be secured by Letters Patent is:

1. An electrical connector for providing electrical connection between a plurality of card contacts on a printed circuit card and a plurality of board contacts on a printed circuit board, said printed circuit card being generally planar and having first and second faces, said first and second faces each having upper and lower rows of card contacts, said card contacts of said upper row being electrically isolated from those of said lower row, said connector comprising:

- a housing having a base, an elongated cavity for receiving said card contacts, and a plurality of terminal receiving slots along the cavity; and
- a plurality of first and second resiliently deflectable terminals stamped from sheet metal stock to create a stamped edge which is perpendicular to said sheet metal stock, each terminal having a base and a beam section, each beam section extending in cantilever fashion away from said base to a U-shaped section, a contacting portion of the stamped edge of each U-shaped section making contact with one of said plurality of card contacts, the beam section of each first terminal being longer than the beam section of said second terminal, the beam section of each first terminal being stiffer where it emerges from the base than the beam section of each second terminal where it emerges from the base, and the first and second terminals are dimensioned so that the contacting portion of said first and second terminals exert equal normal forces on said card contacts.

2. The electrical connector of claim 1 wherein the beam section of each said first and second terminals taper uniformly from the respective base thereof to the respective U-shaped section.

3. The electrical connector of claim 1 wherein the beam section on said first terminal emerges from its respective base at a first point and the beam section of said second terminal emerges from its respective base at a second point, the cross-sectional dimension of the beam section of said first terminal being greater than the cross-sectional dimension of the second terminal taken at equal distances along the respective beam sections from the first and second points.

4. An electrical connector for providing electrical connection between a plurality of card contacts located on a first substrate generally adjacent an edge thereof and a plurality of board contacts on a second substrate, said first substrate being generally planar and having first and second faces, said first and second faces each having upper and lower rows of card contacts generally parallel to said edge, said upper row being positioned further from said edge than said lower row and being displaced from said lower row along said edge, said connector comprising:

- a housing having an elongated cavity for receiving said card contacts, and a plurality of terminal receiving apertures along the cavity; and
- a plurality of first and second resiliently deflectable terminals stamped from sheet metal stock to create a stamped edge which is perpendicular to said sheet metal stock, each terminal having a base, means extending in one direction from said base for contacting one of said board contacts, and a beam section, each beam section extending in cantilever fashion away from said base in a second direction opposite said first direction to a contact section, a contacting portion of the stamped edge of each contact section making contact with one of said plurality of card contacts, the beam section of each first terminal being longer than the beam section of said second terminal, wherein said first terminals have a high contact point, said second terminals have a low contact point, there being electrical path parts defined by a circuit card operatively positioned in the housing cavity between a top surface of the housing and each of the high and low contact points and a first electrical path defined by the distance along a circuit card operatively positioned in the housing cavity from said top surface of said connector housing to said high contact point of said first terminal plus the distance from said high contact point through said first terminal to said printed circuit board is equal to a second electrical path defined by the distance along said circuit card operatively positioned in the housing cavity from said top surface to said low contact point of said second terminal plus the distance from said low contact point through said second terminal to said printed circuit board to thereby avoid signal skew and out of timing sequence, and wherein the beam section of said first and second terminals are dimensioned so that the contacting portion of said first and second terminals exert equal normal forces on said card contacts.

5. The electrical connector of claim 4 wherein the beam section of each said first and second terminals taper uniformly from the respective base thereof to the respective contact section.

6. The electrical connector of claim 4 wherein the beam section on said first terminal emerges from its respective base at a first point and the beam section of said second terminal emerges from its respective base at a second point, the cross-sectional dimension of the beam section of said first terminal being greater than the cross-sectional dimension of the second terminal taken at equal distances along the respective beam sections from the first and second points.

* * * * *